United States Patent
Cao

(10) Patent No.: US 9,886,927 B2
(45) Date of Patent: Feb. 6, 2018

(54) DISPLAY DEVICE, TFT SUBSTRATE AND GOA DRIVING CIRCUIT

(71) Applicants: Shenzhen China Star Optoelectronics Technology Co., Ltd., Shenzhen, Guangdong (CN); Wuhan China Star Optoelectronics Technology Co., Ltd., Wuhan, Hubei (CN)

(72) Inventor: Shangcao Cao, Guangdong (CN)

(73) Assignees: Shenzhen China Star Optoelectronics Technology Co., Ltd., Shenzhen, Guangdong (CN); Wuhan China Star Optoelectronics Technology Co., Ltd., Wuhan, Hubei (CN)

( * ) Notice: Subject to any disclaimer, the term of this patent is extended or adjusted under 35 U.S.C. 154(b) by 155 days.

(21) Appl. No.: 14/894,357

(22) PCT Filed: Oct. 21, 2015

(86) PCT No.: PCT/CN2015/092354
§ 371 (c)(1),
(2) Date: Nov. 26, 2015

(87) PCT Pub. No.: WO2017/054260
PCT Pub. Date: Apr. 6, 2017

(65) Prior Publication Data
US 2017/0193943 A1 Jul. 6, 2017

(51) Int. Cl.
*G09G 3/36* (2006.01)
*G11C 19/28* (2006.01)
(Continued)

(52) U.S. Cl.
CPC .......... *G09G 3/3677* (2013.01); *G11C 19/28* (2013.01); *H01L 27/124* (2013.01);
(Continued)

(58) Field of Classification Search
CPC ... G09G 2300/0408; G09G 2310/0264; G09G 2310/0286; G09G 2310/0289;
(Continued)

(56) References Cited

U.S. PATENT DOCUMENTS

2017/0010731 A1* 1/2017 Zhang ..................... G11C 19/28
2017/0154594 A1* 6/2017 Xiao ..................... G09G 3/3677
2017/0162150 A1* 6/2017 Xiao ..................... G09G 3/3677

* cited by examiner

*Primary Examiner* — Dmitriy Bolotin
(74) *Attorney, Agent, or Firm* — Andrew C. Cheng

(57) ABSTRACT

A display device, a TFT substrate and a GOA driving circuit are disclosed. An driving unit of the GOA driving circuit includes an input module for outputting a first control signal according to the signals received; an output module for outputting a first output control signal according to a first control signal and a first clock signal; a pull-down module for outputting a pull-down signal according to the first control signal, a second clock signal and a low voltage level signal; a pull-down maintaining module for outputting a second output control signal according to the pull-down signal, a high voltage level signal and the first clock signal, wherein, the first output control signal and the second output control signal act commonly in order to obtain an output signal. The GOA driving circuit of the present invention can perform a pause or a stage transferring.

16 Claims, 4 Drawing Sheets

(51) Int. Cl.
*H03K 17/687* (2006.01)
*H01L 27/12* (2006.01)

(52) U.S. Cl.
CPC ...... *H01L 27/1222* (2013.01); *H01L 27/1255* (2013.01); *H03K 17/6871* (2013.01); *G09G 2300/0408* (2013.01); *G09G 2310/0264* (2013.01); *G09G 2310/0286* (2013.01); *G09G 2310/0289* (2013.01); *G09G 2310/08* (2013.01); *G09G 2330/021* (2013.01)

(58) Field of Classification Search
CPC ......... G09G 2310/08; G09G 2330/021; G09G 3/3677; G11C 19/28; H01L 27/1222; H01L 27/124; H01L 27/1255; H03K 17/6871
See application file for complete search history.

DISPLAY DEVICE, TFT SUBSTRATE AND GOA DRIVING CIRCUIT

BACKGROUND OF THE INVENTION

1. Field of the Invention

The present invention relates to a display technology field, and more particularly to a display device, a TFT substrate and a GOA driving circuit.

2. Description of Related Art

An embedded touch panel can realize a thinner case and a better user experience so that more and more users demand for the embedded touch panel. A driving frequency of the embedded touch panel relates to the sensitivity and the precision of a touching action. A touch driving frequency reaching 120 Hz is favored by panel makers. However, the above driving method requires scanning multiple times in a frame. When a touch panel is driven and the driving of a GOA (Gate On Array) requires interrupting, the difficulty for designing a GOA driving circuit is increased.

SUMMARY OF THE INVENTION

The main technology problem solved by the present invention is to provide a display device, a TFT substrate and a GOA driving circuit in order to realize a pause or a stage transferring, a high frequency touch panel driving, and saving the cost of the IC in a maximum degree.

In order to solve the above technology problem, a technology solution adopted by the present invention is: a Gate-On-Array (GOA) driving circuit including multiple staged driving units, and each driving unit comprises: an input module for receiving a touch control signal, a low voltage level signal, a high voltage level signal and an output signal of a previous stage driving unit, and for outputting a first control signal according to the signals received, wherein, the input module of the first stage driving unit receives the touch control signal, the low voltage level signal, the high voltage level signal and a preset starting signal; an output module for receiving the first control signal and a first clock signal, and for outputting a first output control signal according to the first control signal and the first clock signal; a pull-down module for receiving the first control signal, a second clock signal and the low voltage level signal, and for outputting a pull-down signal according to the first control signal, the second clock signal and the low voltage level signal, the second clock signal and the first clock signal are opposite in phase; and a pull-down maintaining module for receiving the pull-down signal, the high voltage level signal and the first clock signal, and for outputting a second output control signal according to the pull-down signal, the high voltage level signal and the first clock signal, wherein, the first output control signal and the second output control signal act commonly in order to obtain an output signal.

Wherein the input module includes a first switching transistor, a second switching transistor and a first capacitor, wherein: a control terminal of the first switching transistor receives the output signal of the previous stage driving unit, an input terminal of the first switching transistor receives the low voltage level signal, an output terminal of the first switching transistor is connected to an input terminal of the second switching transistor, and a control terminal of a first switching transistor of the first stage driving unit receives the preset starting signal; a control terminal of the second switching transistor receives the touch control signal, the input terminal of the second switching transistor is connected to the output terminal of the first switching transistor, and an output terminal of the second switching transistor outputs the first control signal; and the first capacitor has two terminals, one terminal of the first capacitor receives the high voltage level signal, and the other terminal of the first capacitor is connected to the input terminal of the second switching transistor.

Wherein, the output module includes a third switching transistor and a second capacitor, wherein: a control terminal of the third switching transistor is connected to the output terminal of the second switching transistor in order to receive the first control signal, an input terminal of the third switching transistor receives the first clock signal, an output terminal of the third switching transistor outputs the first output control signal; and two terminals of the second capacitor are respectively connected to the control terminal and the output terminal of the third switching transistor.

Wherein, the pull-down signal includes a first pull-down signal and a second pull-down signal, and the pull-down module includes a fourth switching transistor and a fifth switching transistor, wherein: a control terminal of the fourth switching transistor is connected to the output terminal of the second switching transistor in order to receive the first control signal, an input terminal of the fourth switching transistor receives the second clock signal, an output terminal of the fourth switching transistor outputs the first pull-down signal; and a control terminal of the fifth switching transistor receives the second clock signal, an input terminal of the fifth switching transistor receives the low voltage signal, and an output terminal of the fifth switching transistor outputs the second pull-down signal.

Wherein, the pull-down maintaining module includes a sixth switching transistor, a seventh switching transistor, an eighth switching transistor and a third capacitor, wherein: a control terminal of the sixth switching transistor receives the first clock signal, an input terminal of the sixth switching transistor is connected to an output terminal of the seventh switching transistor, and an output terminal of the sixth switching transistor is connected to the control terminal of the third switching transistor; a control terminal of the seventh switching transistor is connected to the output terminal of the fourth switching transistor and the output terminal of the fifth switching transistor in order to receive the pull-down signal, an input terminal of the seventh switching transistor receives the high voltage level signal, and the output terminal of the seventh switching transistor is connected to the input terminal of the sixth switching transistor; and a control terminal of the eighth switching transistor is connected to the output terminal of the fourth switching transistor and the output terminal of the fifth switching transistor in order to receive the pull-down signal, an input terminal of the eighth switching transistor receives the high voltage level signal, and an output terminal of the eighth switching transistor outputs the second output control signal; and the third capacitor has two terminals, one terminal of the third capacitor is connected to the control terminal of the seventh switching transistor and the control terminal of the eighth switching transistor, and the other terminal of the third capacitor receives the high voltage level signal.

Wherein, the GOA driving circuit further comprises a ninth switching transistor, a control terminal of the ninth switching transistor receives the low voltage level signal, an input terminal of the ninth switching transistor is connected to the output terminal of the second switching transistor, and an output terminal of the ninth switching transistor is connected to the control terminal of the third switching transistor.

Wherein, the ninth switching transistor is a P-type transistor, the control terminal of the ninth switching transistor is a gate electrode of the P-type transistor, the input terminal of the ninth switching transistor is a source electrode of the P-type transistor, and the output terminal of the ninth switching transistor is a drain electrode of the P-type transistor.

Wherein, the first switching transistor to the eighth switching transistor are all P-type transistors, the control terminal of each of the first switching transistor to the eighth switching transistor is a gate electrode of the P-type transistor, the input terminal of each of the first switching transistor to the eighth switching transistor is a source electrode of the P-type transistor, and the output terminal of the first switching transistor to the eighth switching transistor is a drain electrode of the P-type transistor.

In order to solve the above technology problem, another technology solution adopted by the present invention is: a thin-film-transistor (TFT) substrate, wherein the TFT substrate a Gate-On-Array (GOA) driving circuit, the GOA driving circuit includes multiple staged driving units, and each driving unit comprises: an input module for receiving a touch control signal, a low voltage level signal, a high voltage level signal and an output signal of a previous stage driving unit, and for outputting a first control signal according to the signals received, wherein, the input module of the first stage driving unit receives the touch control signal, the low voltage level signal, the high voltage level signal and a preset starting signal; an output module for receiving the first control signal and a first clock signal, and for outputting a first output control signal according to the first control signal and the first clock signal; a pull-down module for receiving the first control signal, a second clock signal and the low voltage level signal, and for outputting a pull-down signal according to the first control signal, the second clock signal and the low voltage level signal, the second clock signal and the first clock signal are opposite in phase; and a pull-down maintaining module for receiving the pull-down signal, the high voltage level signal and the first clock signal, and for outputting a second output control signal according to the pull-down signal, the high voltage level signal and the first clock signal, wherein, the first output control signal and the second output control signal act commonly in order to obtain an output signal.

Wherein the input module includes a first switching transistor, a second switching transistor and a first capacitor, wherein: a control terminal of the first switching transistor receives the output signal of the previous stage driving unit, an input terminal of the first switching transistor receives the low voltage level signal, an output terminal of the first switching transistor is connected to an input terminal of the second switching transistor, and a control terminal of a first switching transistor of the first stage driving unit receives the preset starting signal; a control terminal of the second switching transistor receives the touch control signal, the input terminal of the second switching transistor is connected to the output terminal of the first switching transistor, and an output terminal of the second switching transistor outputs the first control signal; and the first capacitor has two terminals, one terminal of the first capacitor receives the high voltage level signal, and the other terminal of the first capacitor is connected to the input terminal of the second switching transistor.

Wherein, the output module includes a third switching transistor and a second capacitor, wherein: a control terminal of the third switching transistor is connected to the output terminal of the second switching transistor in order to receive the first control signal, an input terminal of the third switching transistor receives the first clock signal, an output terminal of the third switching transistor outputs the first output control signal; and two terminals of the second capacitor are respectively connected to the control terminal and the output terminal of the third switching transistor.

Wherein, the pull-down signal includes a first pull-down signal and a second pull-down signal, and the pull-down module includes a fourth switching transistor and a fifth switching transistor, wherein: a control terminal of the fourth switching transistor is connected to the output terminal of the second switching transistor in order to receive the first control signal, an input terminal of the fourth switching transistor receives the second clock signal, an output terminal of the fourth switching transistor outputs the first pull-down signal; and a control terminal of the fifth switching transistor receives the second clock signal, an input terminal of the fifth switching transistor receives the low voltage signal, and an output terminal of the fifth switching transistor outputs the second pull-down signal.

Wherein, the pull-down maintaining module includes a sixth switching transistor, a seventh switching transistor, an eighth switching transistor and a third capacitor, wherein: a control terminal of the sixth switching transistor receives the first clock signal, an input terminal of the sixth switching transistor is connected to an output terminal of the seventh switching transistor, and an output terminal of the sixth switching transistor is connected to the control terminal of the third switching transistor; a control terminal of the seventh switching transistor is connected to the output terminal of the fourth switching transistor and the output terminal of the fifth switching transistor in order to receive the pull-down signal, an input terminal of the seventh switching transistor receives the high voltage level signal, and the output terminal of the seventh switching transistor is connected to the input terminal of the sixth switching transistor; and a control terminal of the eighth switching transistor is connected to the output terminal of the fourth switching transistor and the output terminal of the fifth switching transistor in order to receive the pull-down signal, an input terminal of the eighth switching transistor receives the high voltage level signal, and an output terminal of the eighth switching transistor outputs the second output control signal; and the third capacitor has two terminals, one terminal of the third capacitor is connected to the control terminal of the seventh switching transistor and the control terminal of the eighth switching transistor, and the other terminal of the third capacitor receives the high voltage level signal.

Wherein, the GOA driving circuit further comprises a ninth switching transistor, a control terminal of the ninth switching transistor receives the low voltage level signal, an input terminal of the ninth switching transistor is connected to the output terminal of the second switching transistor, and an output terminal of the ninth switching transistor is connected to the control terminal of the third switching transistor.

In order to solve the above technology problem, another technology solution adopted by the present invention is: a display device, wherein the display device includes a thin-film-transistor (TFT) substrate, the TFT substrate a Gate-On-Array (GOA) driving circuit, the GOA driving circuit includes multiple staged driving units, and each driving unit comprises: an input module for receiving a touch control signal, a low voltage level signal, a high voltage level signal and an output signal of a previous stage driving unit, and for outputting a first control signal according to the signals received, wherein, the input module of the first stage driving unit receives the touch control signal, the low voltage level signal, the high voltage level signal and a preset starting signal; an output module for receiving the first control signal and a first clock signal, and for outputting a first output control signal according to the first control signal and the first clock signal; a pull-down module for receiving the first control signal, a second clock signal and the low voltage level signal, and for outputting a pull-down signal according to the first control signal, the second clock signal and the low voltage level signal, the second clock signal and the first clock signal are opposite in phase; and a pull-down maintaining module for receiving the pull-down signal, the high voltage level signal and the first clock signal, and for outputting a second output control signal according to the pull-down signal, the high voltage level signal and the first clock signal, wherein, the first output control signal and the second output control signal act commonly in order to obtain an output signal.

Wherein, the input module includes a first switching transistor, a second switching transistor and a first capacitor, wherein: a control terminal of the first switching transistor receives the output signal of the previous stage driving unit, an input terminal of the first switching transistor receives the low voltage level signal, an output terminal of the first switching transistor is connected to an input terminal of the second switching transistor, and a control terminal of a first switching transistor of the first stage driving unit receives the preset starting signal; a control terminal of the second switching transistor receives the touch control signal, the input terminal of the second switching transistor is connected to the output terminal of the first switching transistor, and an output terminal of the second switching transistor outputs the first control signal; and the first capacitor has two terminals, one terminal of the first capacitor receives the high voltage level signal, and the other terminal of the first capacitor is connected to the input terminal of the second switching transistor.

Wherein, the output module includes a third switching transistor and a second capacitor, wherein: a control terminal of the third switching transistor is connected to the output terminal of the second switching transistor in order to receive the first control signal, an input terminal of the third switching transistor receives the first clock signal, an output terminal of the third switching transistor outputs the first output control signal; and two terminals of the second capacitor are respectively connected to the control terminal and the output terminal of the third switching transistor.

Wherein, the pull-down signal includes a first pull-down signal and a second pull-down signal, and the pull-down module includes a fourth switching transistor and a fifth switching transistor, wherein: a control terminal of the fourth switching transistor is connected to the output terminal of the second switching transistor in order to receive the first control signal, an input terminal of the fourth switching transistor receives the second clock signal, an output terminal of the fourth switching transistor outputs the first pull-down signal; and a control terminal of the fifth switching transistor receives the second clock signal, an input terminal of the fifth switching transistor receives the low voltage signal, and an output terminal of the fifth switching transistor outputs the second pull-down signal.

Wherein, the pull-down maintaining module includes a sixth switching transistor, a seventh switching transistor, an eighth switching transistor and a third capacitor, wherein: a control terminal of the sixth switching transistor receives the first clock signal, an input terminal of the sixth switching transistor is connected to an output terminal of the seventh switching transistor, and an output terminal of the sixth switching transistor is connected to the control terminal of the third switching transistor; a control terminal of the seventh switching transistor is connected to the output terminal of the fourth switching transistor and the output terminal of the fifth switching transistor in order to receive the pull-down signal, an input terminal of the seventh switching transistor receives the high voltage level signal, and the output terminal of the seventh switching transistor is connected to the input terminal of the sixth switching transistor; and a control terminal of the eighth switching transistor is connected to the output terminal of the fourth switching transistor and the output terminal of the fifth switching transistor in order to receive the pull-down signal, an input terminal of the eighth switching transistor receives the high voltage level signal, and an output terminal of the eighth switching transistor outputs the second output control signal; and the third capacitor has two terminals, one terminal of the third capacitor is connected to the control terminal of the seventh switching transistor and the control terminal of the eighth switching transistor, and the other terminal of the third capacitor receives the high voltage level signal.

Wherein, the GOA driving circuit further comprises a ninth switching transistor, a control terminal of the ninth switching transistor receives the low voltage level signal, an input terminal of the ninth switching transistor is connected to the output terminal of the second switching transistor, and an output terminal of the ninth switching transistor is connected to the control terminal of the third switching transistor.

The beneficial effects of the present invention are: comparing to the conventional art, the present invention provides a Gate-On-Array (GOA) driving circuit including multiple staged driving units, and each driving unit includes an input module, an output module, a pull-down module and a pull-down maintaining module. Wherein, the input module for receiving a touch control signal, a low voltage level signal, a high voltage level signal and an output signal of a previous stage driving unit, and for outputting a first control signal according to the signals received, wherein, the input module of the first stage driving unit receives the touch control signal, the low voltage level signal, the high voltage level signal and a preset starting signal. The output module for receiving the first control signal and a first clock signal, and for outputting a first output control signal according to the first control signal and the first clock signal. The pull-down module for receiving the first control signal, a second clock signal and the low voltage level signal, and for outputting a pull-down signal according to the first control signal, the second clock signal and the low voltage level signal, the second clock signal and the first clock signal are opposite in phase. The pull-down maintaining module for receiving the pull-down signal, the high voltage level signal and the first clock signal, and for outputting a second output control signal according to the pull-down signal, the high voltage level signal and the first clock signal, wherein, the first output control signal and the second output control signal act commonly in order to obtain an output signal. Therefore, the GOA driving circuit 10 can perform a pause or a stage transferring according to the touch control signal TC in order to realize a high frequency touch panel driving, and furthermore, the integrated-circuit (IC) cost can be saved in a maximum degree.

DETAILED DESCRIPTION OF THE PREFERRED EMBODIMENT

Figure 1:
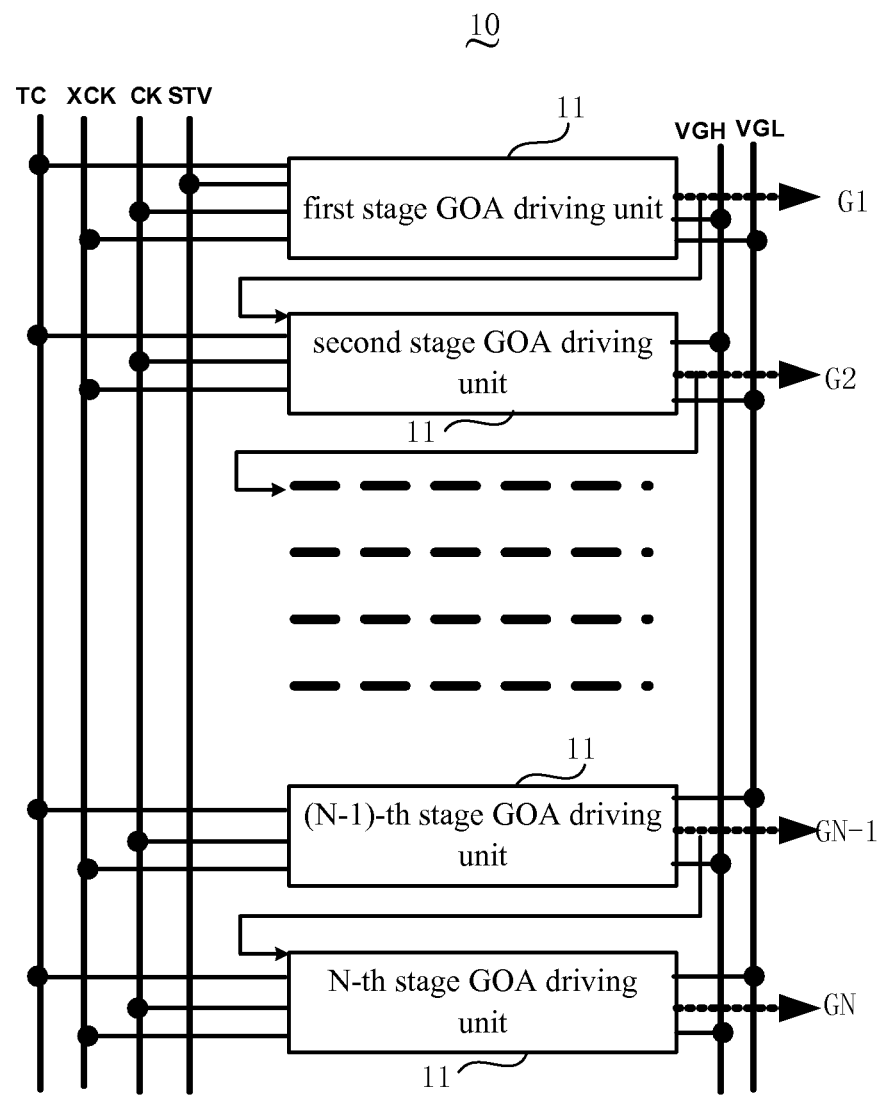
FIG. 1 is a schematic structure of a GOA driving circuit according to an embodiment of the present invention.

With reference to FIG. 1, and FIG. 1 is a schematic structure of a GOA driving circuit according to an embodiment of the present invention.

As shown in FIG. 1, the GOA driving circuit 10 of the embodiment of the present invention includes multiple staged driving units 11. Wherein, each driving unit 11 receives a touch control signal TC, a low voltage level signal VGL, a high voltage level signal VGH, a previous stage driving signal Gn−1, a first clock signal CK and a second clock signal XCK. Wherein, as shown in FIG. 1, the previous stage driving signal received by a first stage driving unit 11 is replaced as a preset starting signal STV. Therefore, the GOA driving circuit 10 can perform a pause or a stage transferring according to the touch control signal TC in order to realize a high frequency touch panel driving, and furthermore, the integrated-circuit (IC) cost can be saved in a maximum degree.

Because each GOA driving unit 11 is the same, therefore, the following content utilizes one GOA driving unit for illustrating.

Figure 2:
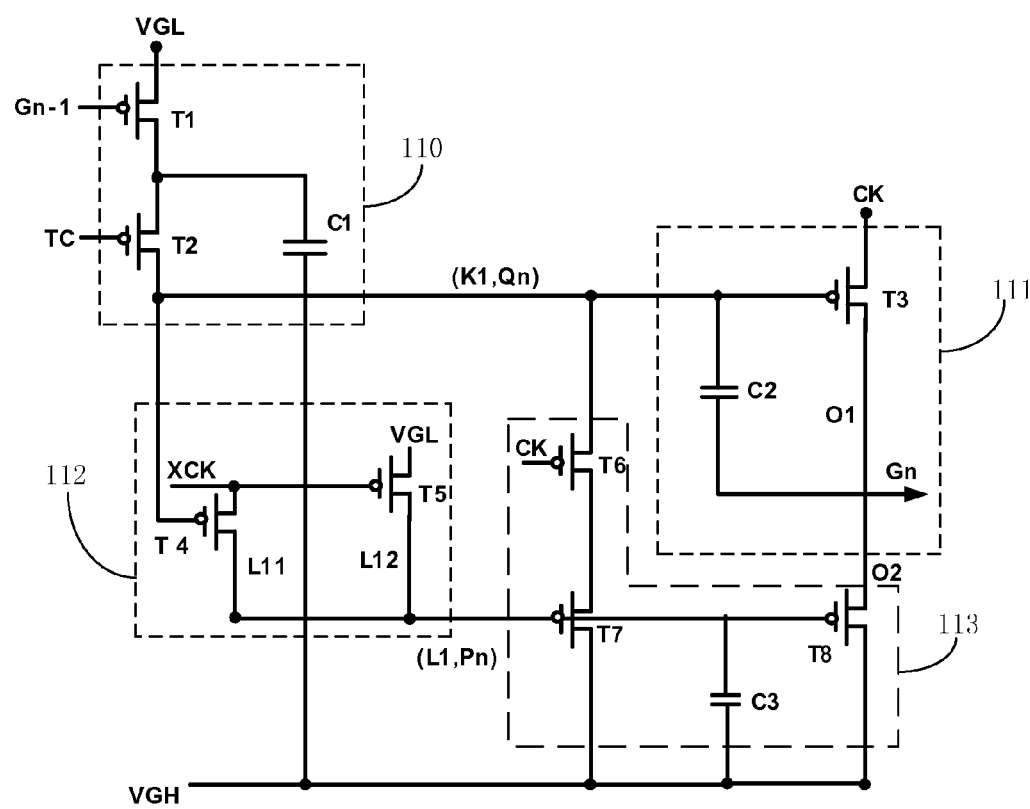
FIG. 2 is a schematic circuit diagram of an n-th stage driving unit of the GOA driving circuit according to an embodiment of the present invention.

With reference to FIG. 2, and FIG. 2 is a schematic circuit diagram of an n-th driving unit of the GOA driving circuit according to an embodiment of the present invention. As shown in FIG. 2, the driving unit 11 includes an input module 110, an output module 111, a pull-down module 112 and a pull-down maintaining module 113.

Wherein, the input module 110 is used for receiving the touch control signal TC, the low voltage level signal VGL, the high voltage level signal VGH and an output signal Gn−1 of a previous stage driving unit, and for outputting a first control signal K1 according to the signals received. Wherein, the first control signal K1 is outputted to a first node Qn. The first node Qn is a node for controlling an output of a driving signal. Wherein, an input module 110 of the first stage driving unit 11 receives the touch control signal TC, the low voltage level signal VGL, the high voltage level signal VGH and the preset starting signal STV.

The output module 111 is used for receiving the first control signal K1 and a first clock signal CK, and for outputting a first output control signal O1 according to the first control signal K1 and the first clock signal CK.

The pull-down module 112 is used for receiving the first control signal K1, a second clock signal XCK and the low voltage level signal VGL, and for outputting a pull-down signal L1 according to the first control signal K1, the second clock signal XCK and the low voltage level signal VGL. Wherein, the pull-down signal L1 is outputted to a second node Pn. The second node Pn is a node for maintaining a stable outputting of the circuit when the circuit is under a non-operation period. Wherein, the second clock signal XCK and the first clock signal CK are opposite in phase.

The pull-down maintaining module 113 is used for receiving the pull-down signal L1, the high voltage level signal VGH and the first clock signal CK, and for outputting a second output control signal O2 according to the pull-down signal L1, the high voltage level signal VGH and the first clock signal CK. Wherein, the first output control signal O1 and the second output control signal O2 act commonly in order to obtain an output signal Gn.

Optionally, the input module 110 includes a first switching transistor T1, a second switching transistor T2 and a first capacitor C1. Wherein, a control terminal of the first switching transistor T1 receives the output signal Gn−1 of the previous stage driving unit. An input terminal of the first switching transistor T1 receives the low voltage level signal VGL. An output terminal of the first switching transistor T1 is connected to an input terminal of the second switching transistor T2. Wherein, a control terminal of a first switching transistor T1 of the first stage driving unit receives the preset starting signal STV.

A control terminal of the second switching transistor T2 receives the touch control signal TC. The input terminal of the second switching transistor T2 is connected to the output terminal of the first switching transistor T1. An output terminal of the second switching transistor T2 outputs the first control signal K1. Specifically, the output terminal of the second switching transistor T2 is connected to the first node Qn in order to output the first control signal K1 to the first node Qn. The first capacitor has two terminals. One terminal of the first capacitor C1 receives the high voltage level signal VGH. The other terminal of the first capacitor C1 is connected to the input terminal of the second switching transistor T2. That is, the other terminal is connected between the input terminal of the second switching transistor T2 and the output terminal of the first switching transistor T1. The first capacitor C1 is used to stabilize a voltage on the input terminal of the second switching transistor T2.

The output module 111 includes a third switching transistor T3 and a second capacitor C2. Wherein, a control terminal of the third switching transistor T3 is connected to the output terminal of the second switching transistor T2 in order to receive the first control signal K1. Specifically, the control terminal of the third switching transistor T3 is connected to the first node Qn in order to receive the first control signal K1 outputted from the second switching transistor T2 through the first node Qn. An input terminal of the third switching transistor T3 receives the first clock signal CK. An output terminal of the third switching transistor T3 outputs the first output control signal O1. Two terminals of the second capacitor C2 are respectively connected to the control terminal and the output terminal of the third switching transistor T3. That is, one terminal of the second capacitor C2 and the control terminal of the third switching transistor T3 are both connected to the first node Qn.

In the present embodiment, the pull-down signal L1 includes a first pull-down signal L11 and a second pull-down signal L12. The pull-down module 112 includes a fourth switching transistor T4 and a fifth switching transistor T5. Wherein, a control terminal of the fourth switching transistor T4 is connected to the output terminal of the second switching transistor T2 in order to receive the first control signal K1. Specifically, the control terminal of the fourth switching transistor T4 and the output terminal of the second switching transistor T2 are both connected to the first node Qn. An input terminal of the fourth switching transistor T4 receives the second clock signal XCK. An output terminal of the fourth switching transistor T4 outputs the first pull-down signal L11. Specifically, the output terminal of the fourth switching transistor T4 is connected to the second node Pn in order to output the first pull-down signal L11 to the second node Pn. A control terminal of the fifth switching transistor T5 receives the second clock signal XCK. An input terminal of the fifth switching transistor T5 receives the low voltage signal VGL. An output terminal of the fifth switching transistor T5 outputs the second pull-down signal L12. Specifically, the output terminal of the fifth switching transistor T5 is connected to the second node Pn in order to output the second pull-down signal L12 to the second node Pn.

The pull-down maintaining module 113 includes a sixth switching transistor T6, a seventh switching transistor T7, and an eighth switching transistor T8 and a third capacitor C3. Wherein, a control terminal of the sixth switching transistor T6 receives the first clock signal CK, an input terminal of the sixth switching transistor T6 is connected to an output terminal of the seventh switching transistor T7. An output terminal of the sixth switching transistor T6 is connected to the first node Qn in order to connect to the control terminal of the third switching transistor T3 through the first node Qn. A control terminal of the seventh switching transistor T7 is connected to the output terminal of the fourth switching transistor T4 and the output terminal of the fifth switching transistor T5 through the second node Pn in order to receive the pull-down signal L1. An input terminal of the seventh switching transistor T7 receives the high voltage level signal VGH. The output terminal of the seventh switching transistor T7 is connected to the input terminal of the sixth switching transistor T6. A control terminal of the eighth switching transistor T8 is connected to the output terminal of the fourth switching transistor T4 and the output terminal of the fifth switching transistor T5 through the second node Pn in order to receive the pull-down signal L1. An input terminal of the eighth switching transistor T8 receives the high voltage level signal VGH. An output terminal of the eighth switching transistor T8 outputs the second output control signal O2. The third capacitor C3 has two terminals. One terminal of the third capacitor C3 is connected to the control terminal of the seventh switching transistor T7 and the control terminal of the eighth switching transistor T8. The other terminal of the third capacitor C3 receives the high voltage level signal VGH.

Wherein, the first switching transistor T1 to the eighth switching transistor T8 are all P-type transistors. The control terminal of each of the first switching transistor T1 to the eighth switching transistor T8 is a gate electrode of the P-type transistor. The input terminal of each of the first switching transistor T1 to the eighth switching transistor T8 is a source electrode of the P-type transistor. The output terminal of the first switching transistor T1 to the eighth switching transistor T8 is a drain electrode of the P-type transistor.

Figure 3:
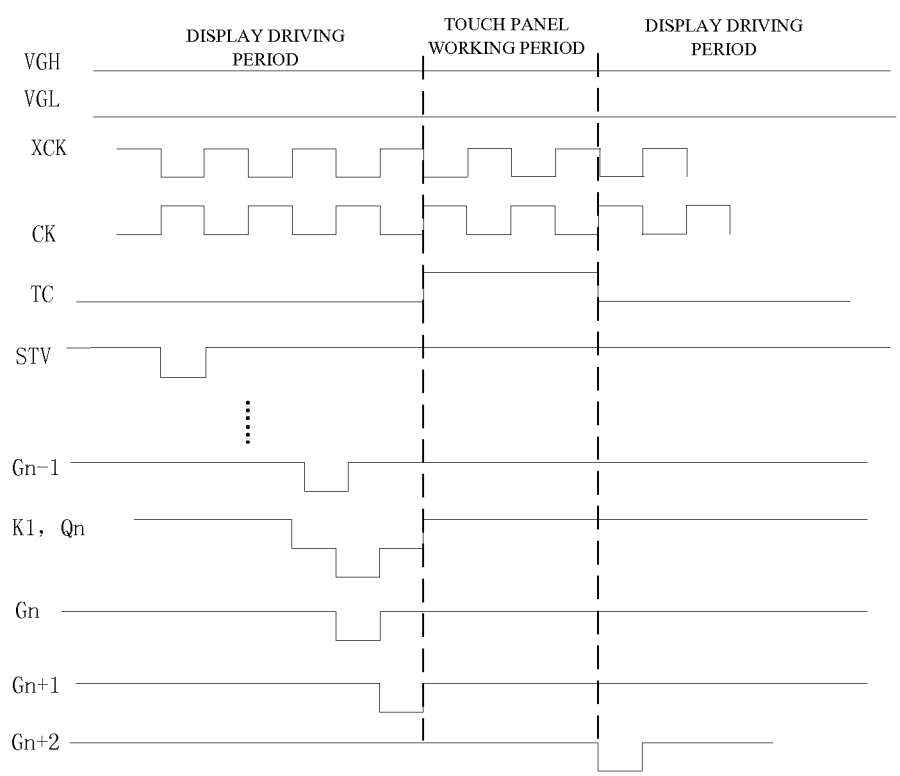
FIG. 3 is a timing diagram of each signal when the GOA driving circuit is working.

With combined reference to FIG. 3, and FIG. 3 is a timing diagram of each signal when the GOA driving circuit is working. With reference to FIG. 2 and FIG. 3, the operation of the GOA driving circuit of the present invention includes a display driving period and a touch panel working period. Wherein, the display driving period includes four stages. Specifically, please refer to the following content:

First stage: the first switching transistor T1 and the second switching transistor T2 are turned on. The low voltage level VGL acts as the first control signal K1 to pull down the first node to a low voltage level. The control terminals of the third switching transistor T3 and the fourth switching transistor T4 are at low voltage levels. Therefore, the third switching transistor T3 and the fourth switching transistor T4 are both turned on. At this time, the second clock signal XCK is at a low voltage level, and the fifth switching transistor T5 is turned on such that the first pull-down signal L11 and the second pull-down signal L12 are both at low voltage levels so that the outputted pull-down signal L1 is at a low voltage level, pulling down the second node Pn to be at a low voltage level such that the seventh switching transistor T7 and the eighth switching transistor T8 are both turned on. Besides, the first clock signal which is opposite to the second clock signal XCK in phase is at a high voltage level such that the sixth switching transistor T6 is turned off. The first output control signal O1 outputted from the third switching transistor T3 is at a high voltage level, and the second output control signal O2 outputted from the eighth switching transistor T8 is also at a high voltage level such that the output signal Gn is at a high voltage level.

Second stage: the second capacitor C2 is charged at the first stage, and a terminal of the second capacitor C2 connected with the first node Qn is at a low voltage level, Therefore, the first node Qn is still at a low voltage level, that is, the second capacitor C2 maintains the first control signal K1 to be at a low voltage level so that the third switching transistor T3 is turned on. At this time, the first clock signal CK is at a low voltage level so that the output signal Gn is at a low voltage level. On one hand, pixel units at display area of a thin film transistor substrate (AA region) can be driven. On the other hand, the output signal Gn can act as a stage-transferring signal to be transferred to a next stage driving unit.

Besides, because the first control signal K1 is at a low voltage level, the fourth switching transistor T4 is turned on. At this time, the second clock signal XCK is at a high voltage level such that the first pull-down signal L11 is at a high voltage level, the fifth switching transistor T5 is turned off, and the pull-down signal L1 is at a high voltage level, that is, the second node Pn is at a high voltage level. Accordingly, the seventh switching transistor T7 and the eighth switching transistor T8 are turned off, the second output control signal O2 is disappeared. The first node Qn is coupled to a lower voltage level through the second capacitor C2 such that the first control signal K1 becomes a lower voltage level in order to ensure that the output signal Gn can output normally.

Third stage: because of the function of the second capacitor C2, the first node Qn is still at a low voltage level, that is, the second capacitor C2 makes the first control signal K1 to be maintained at a low voltage level so that the third switching transistor T3 and the fourth switching transistor T4 are turned on. In this stage, the first clock signal CK is at a high voltage level, and the second clock signal XCK become a low voltage level such that the first output control signal O1 outputted from the third switching transistor T3 is at a high voltage level, the first pull-down signal L11 is at a low voltage level, and the fifth switching transistor T5 is turned on. The second pull-down signal L12 also becomes a low voltage level. Therefore, the pull-down signal L1 is at a low voltage level, that is, the second node Pn becomes a low voltage level. The seventh switching transistor T7 and the eighth switching transistor T8 are turned on such that the outputted second output control signal O2 is at a high voltage level, and second output control signal O2 acts commonly with the first output control signal O1 which is also at a high voltage level such that the output signal Gn is at a high voltage level.

Fourth stage: the first clock signal CK is at a low voltage level, and the sixth switching transistor T6 is turned on. Because of the function of the third capacitor C3, ensuring that the seventh switching transistor T7 is turned on at this time. Therefore, the first control signal K1 at the first node Qn is pulled high instantly such that the third switching transistor T3 and the fourth switching transistor T4 are turned off. In a process which is after a frame, the first control signal K1 at the first node Qn and the pull-down signal L1 at the second node Pn are respectively maintained at a high voltage level and a low voltage level.

When the GOA driving circuit 10 is under a working time of the touch panel, the touch control signal TC becomes a high voltage level such that the second switching transistor T2 is turned off. The stage-transferring signal is temporarily stored on the first capacitor C1. After the working time of the touch panel is finished, the touch control signal TC becomes a low voltage level, the second switching transistor T2 is turned on, a low voltage level temporarily stored on the first capacitor C1 acts as the first control signal K1 to charge the first node Qn such that the first node become low, and the third witching transistor T3 is turned on. Hereafter, following the process described above to perform a stage transferring.

Figure 4:
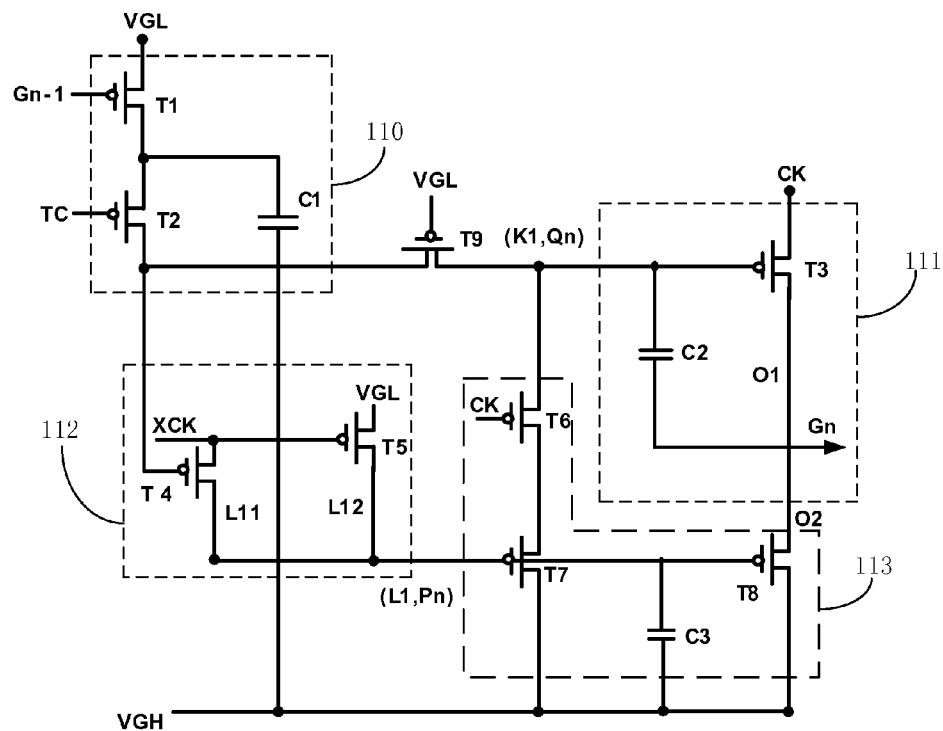
FIG. 4 is a schematic structure of another GOA driving circuit according to an embodiment of the present invention.

With reference to FIG. 4, and FIG. 4 is a schematic structure of another GOA driving circuit according to an embodiment of the present invention. As shown in FIG. 4, the difference between the GOA driving circuit of the present embodiment and the GOA driving circuit described above is: the GOA driving circuit of the present embodiment further includes a ninth switching transistor T9. A control terminal of the ninth switching transistor T9 receives the low voltage level signal VGL. An input terminal of the ninth switching transistor T9 is connected to the output terminal of the second switching transistor T2. An output terminal of the ninth switching transistor T9 is connected to the control terminal of the third switching transistor T3. The function of the ninth switching transistor T9 is that when the first control signal K1 at the first node Qn is coupled to a lower voltage level, the ninth switching transistor T9 is turned off in order to reduce affection to the first control signal K1 at the first node Qn by external environment.

Figure 5:
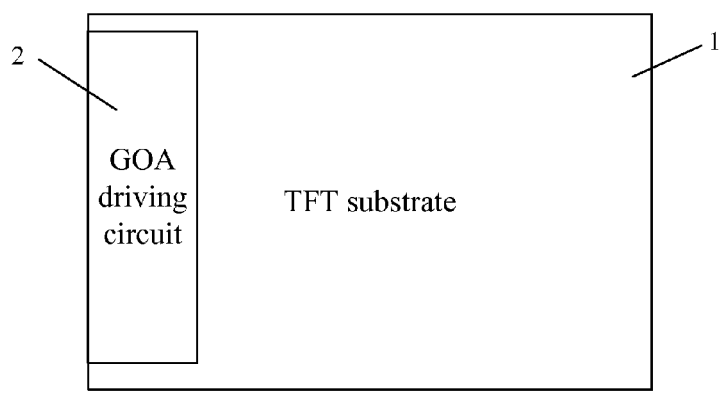
FIG. 5 is a schematic structure diagram of a display device according to an embodiment of the present invention.

With further reference to FIG. 5, and FIG. 5 is a schematic structure diagram of a display device according to an embodiment of the present invention. In the present embodiment, a display device 40 includes a thin-film-transistor (TFT) substrate 1 and a GOA driving circuit 2 located at a side of the TFT substrate 1. Wherein, the GOA driving circuit 2 is the GOA driving circuit 10 described foregoing.

In summary, the GOA driving circuit of the present invention can perform a pause or a stage transferring through the touch control signal TC, which is suitable for a high frequency touch panel driving. Besides, the GOA driving circuit of the present invention requires only nine switching transistors and three capacitors, which can save the cost of the IC in a maximum degree.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A Gate-On-Array (GOA) driving circuit including multiple staged driving units, and each driving unit comprises:

an input module for receiving a touch control signal, a low voltage level signal, a high voltage level signal and an output signal of a previous stage driving unit, and for outputting a first control signal according to the signals received, wherein, the input module of the first stage driving unit receives the touch control signal, the low voltage level signal, the high voltage level signal and a preset starting signal;

an output module for receiving the first control signal and a first clock signal, and for outputting a first output control signal according to the first control signal and the first clock signal;

a pull-down module for receiving the first control signal, a second clock signal and the low voltage level signal, and for outputting a pull-down signal according to the first control signal, the second clock signal and the low voltage level signal, the second clock signal and the first clock signal are opposite in phase; and a pull-down maintaining module for receiving the pull-down signal, the high voltage level signal and the first clock signal, and for outputting a second output control signal according to the pull-down signal, the high voltage level signal and the first clock signal, wherein, the first output control signal and the second output control signal act commonly in order to obtain an output signal.

2. The GOA driving circuit according to claim 1, wherein the input module includes a first switching transistor, a second switching transistor and a first capacitor, wherein:

a control terminal of the first switching transistor receives the output signal of the previous stage driving unit, an input terminal of the first switching transistor receives the low voltage level signal, an output terminal of the first switching transistor is connected to an input terminal of the second switching transistor, and a control terminal of a first switching transistor of the first stage driving unit receives the preset starting signal;

a control terminal of the second switching transistor receives the touch control signal, the input terminal of the second switching transistor is connected to the output terminal of the first switching transistor, and an output terminal of the second switching transistor outputs the first control signal; and the first capacitor has two terminals, one terminal of the first capacitor receives the high voltage level signal, and the other terminal of the first capacitor is connected to the input terminal of the second switching transistor.

3. The GOA driving circuit according to claim 2, wherein, the output module includes a third switching transistor and a second capacitor, wherein:

a control terminal of the third switching transistor is connected to the output terminal of the second switching transistor in order to receive the first control signal, an input terminal of the third switching transistor receives the first clock signal, an output terminal of the third switching transistor outputs the first output control signal; and two terminals of the second capacitor are respectively connected to the control terminal and the output terminal of the third switching transistor.

4. The GOA driving circuit according to claim 3, wherein, the pull-down signal includes a first pull-down signal and a second pull-down signal, and the pull-down module includes a fourth switching transistor and a fifth switching transistor, wherein:

a control terminal of the fourth switching transistor is connected to the output terminal of the second switching transistor in order to receive the first control signal, an input terminal of the fourth switching transistor receives the second clock signal, an output terminal of the fourth switching transistor outputs the first pull-down signal; and a control terminal of the fifth switching transistor receives the second clock signal, an input terminal of the fifth switching transistor receives the low voltage signal, and an output terminal of the fifth switching transistor outputs the second pull-down signal.

5. The GOA driving circuit according to claim 4, wherein, the pull-down maintaining module includes a sixth switching transistor, a seventh switching transistor, an eighth switching transistor and a third capacitor, wherein:

a control terminal of the sixth switching transistor receives the first clock signal, an input terminal of the sixth switching transistor is connected to an output terminal of the seventh switching transistor, and an output terminal of the sixth switching transistor is connected to the control terminal of the third switching transistor;

a control terminal of the seventh switching transistor is connected to the output terminal of the fourth switching transistor and the output terminal of the fifth switching transistor in order to receive the pull-down signal, an input terminal of the seventh switching transistor receives the high voltage level signal, and the output terminal of the seventh switching transistor is connected to the input terminal of the sixth switching transistor; and a control terminal of the eighth switching transistor is connected to the output terminal of the fourth switching transistor and the output terminal of the fifth switching transistor in order to receive the pull-down signal, an input terminal of the eighth switching transistor receives the high voltage level signal, and an output terminal of the eighth switching transistor outputs the second output control signal; and the third capacitor has two terminals, one terminal of the third capacitor is connected to the control terminal of the seventh switching transistor and the control terminal of the eighth switching transistor, and the other terminal of the third capacitor receives the high voltage level signal.

6. The GOA driving circuit according to claim 5, wherein, the first switching transistor to the eighth switching transistor are all P-type transistors, the control terminal of each of the first switching transistor to the eighth switching transistor is a gate electrode of the P-type transistor, the input terminal of each of the first switching transistor to the eighth switching transistor is a source electrode of the P-type transistor, and the output terminal of the first switching transistor to the eighth switching transistor is a drain electrode of the P-type transistor.

7. A thin-film-transistor (TFT) substrate, wherein the TFT substrate a Gate-On-Array (GOA) driving circuit, the GOA driving circuit includes multiple staged driving units, and each driving unit comprises:

an input module for receiving a touch control signal, a low voltage level signal, a high voltage level signal and an output signal of a previous stage driving unit, and for outputting a first control signal according to the signals received, wherein, the input module of the first stage driving unit receives the touch control signal, the low voltage level signal, the high voltage level signal and a preset starting signal;

an output module for receiving the first control signal and a first clock signal, and for outputting a first output control signal according to the first control signal and the first clock signal;

a pull-down module for receiving the first control signal, a second clock signal and the low voltage level signal, and for outputting a pull-down signal according to the first control signal, the second clock signal and the low voltage level signal, the second clock signal and the first clock signal are opposite in phase; and a pull-down maintaining module for receiving the pull-down signal, the high voltage level signal and the first clock signal, and for outputting a second output control signal according to the pull-down signal, the high voltage level signal and the first clock signal, wherein, the first output control signal and the second output control signal act commonly in order to obtain an output signal.

8. The TFT substrate according to claim 7, wherein the input module includes a first switching transistor, a second switching transistor and a first capacitor, wherein:

a control terminal of the first switching transistor receives the output signal of the previous stage driving unit, an input terminal of the first switching transistor receives the low voltage level signal, an output terminal of the first switching transistor is connected to an input terminal of the second switching transistor, and a control terminal of a first switching transistor of the first stage driving unit receives the preset starting signal;

a control terminal of the second switching transistor receives the touch control signal, the input terminal of the second switching transistor is connected to the output terminal of the first switching transistor, and an output terminal of the second switching transistor outputs the first control signal; and the first capacitor has two terminals, one terminal of the first capacitor receives the high voltage level signal, and the other terminal of the first capacitor is connected to the input terminal of the second switching transistor.

9. The TFT substrate according to claim 8, wherein, the output module includes a third switching transistor and a second capacitor, wherein:

a control terminal of the third switching transistor is connected to the output terminal of the second switching transistor in order to receive the first control signal, an input terminal of the third switching transistor receives the first clock signal, an output terminal of the third switching transistor outputs the first output control signal; and two terminals of the second capacitor are respectively connected to the control terminal and the output terminal of the third switching transistor.

10. The TFT substrate according to claim 9, wherein, the pull-down signal includes a first pull-down signal and a second pull-down signal, and the pull-down module includes a fourth switching transistor and a fifth switching transistor, wherein:

a control terminal of the fourth switching transistor is connected to the output terminal of the second switching transistor in order to receive the first control signal, an input terminal of the fourth switching transistor receives the second clock signal, an output terminal of the fourth switching transistor outputs the first pull-down signal; and a control terminal of the fifth switching transistor receives the second clock signal, an input terminal of the fifth switching transistor receives the low voltage signal, and an output terminal of the fifth switching transistor outputs the second pull-down signal.

11. The TFT substrate according to claim 10, wherein, the pull-down maintaining module includes a sixth switching transistor, a seventh switching transistor, an eighth switching transistor and a third capacitor, wherein:
a control terminal of the sixth switching transistor receives the first clock signal, an input terminal of the sixth switching transistor is connected to an output terminal of the seventh switching transistor, and an output terminal of the sixth switching transistor is connected to the control terminal of the third switching transistor;
a control terminal of the seventh switching transistor is connected to the output terminal of the fourth switching transistor and the output terminal of the fifth switching transistor in order to receive the pull-down signal, an input terminal of the seventh switching transistor receives the high voltage level signal, and the output terminal of the seventh switching transistor is connected to the input terminal of the sixth switching transistor; and
a control terminal of the eighth switching transistor is connected to the output terminal of the fourth switching transistor and the output terminal of the fifth switching transistor in order to receive the pull-down signal, an input terminal of the eighth switching transistor receives the high voltage level signal, and an output terminal of the eighth switching transistor outputs the second output control signal; and
the third capacitor has two terminals, one terminal of the third capacitor is connected to the control terminal of the seventh switching transistor and the control terminal of the eighth switching transistor, and the other terminal of the third capacitor receives the high voltage level signal.

12. A display device, wherein the display device includes a thin-film-transistor (TFT) substrate, the TFT substrate a Gate-On-Array (GOA) driving circuit, the GOA driving circuit includes multiple staged driving units, and each driving unit comprises:
an input module for receiving a touch control signal, a low voltage level signal, a high voltage level signal and an output signal of a previous stage driving unit, and for outputting a first control signal according to the signals received, wherein, the input module of the first stage driving unit receives the touch control signal, the low voltage level signal, the high voltage level signal and a preset starting signal;
an output module for receiving the first control signal and a first clock signal, and for outputting a first output control signal according to the first control signal and the first clock signal;
a pull-down module for receiving the first control signal, a second clock signal and the low voltage level signal, and for outputting a pull-down signal according to the first control signal, the second clock signal and the low voltage level signal, the second clock signal and the first clock signal are opposite in phase; and
a pull-down maintaining module for receiving the pull-down signal, the high voltage level signal and the first clock signal, and for outputting a second output control signal according to the pull-down signal, the high voltage level signal and the first clock signal, wherein, the first output control signal and the second output control signal act commonly in order to obtain an output signal.

13. The display device according to claim 12, wherein, the input module includes a first switching transistor, a second switching transistor and a first capacitor, wherein:
a control terminal of the first switching transistor receives the output signal of the previous stage driving unit, an input terminal of the first switching transistor receives the low voltage level signal, an output terminal of the first switching transistor is connected to an input terminal of the second switching transistor, and a control terminal of a first switching transistor of the first stage driving unit receives the preset starting signal;
a control terminal of the second switching transistor receives the touch control signal, the input terminal of the second switching transistor is connected to the output terminal of the first switching transistor, and an output terminal of the second switching transistor outputs the first control signal; and
the first capacitor has two terminals, one terminal of the first capacitor receives the high voltage level signal, and the other terminal of the first capacitor is connected to the input terminal of the second switching transistor.

14. The display device according to claim 13, wherein, the output module includes a third switching transistor and a second capacitor, wherein:
a control terminal of the third switching transistor is connected to the output terminal of the second switching transistor in order to receive the first control signal, an input terminal of the third switching transistor receives the first clock signal, an output terminal of the third switching transistor outputs the first output control signal; and
two terminals of the second capacitor are respectively connected to the control terminal and the output terminal of the third switching transistor.

15. The display device according to claim 14, wherein, the pull-down signal includes a first pull-down signal and a second pull-down signal, and the pull-down module includes a fourth switching transistor and a fifth switching transistor, wherein:
a control terminal of the fourth switching transistor is connected to the output terminal of the second switching transistor in order to receive the first control signal, an input terminal of the fourth switching transistor receives the second clock signal, an output terminal of the fourth switching transistor outputs the first pull-down signal; and
a control terminal of the fifth switching transistor receives the second clock signal, an input terminal of the fifth switching transistor receives the low voltage signal, and an output terminal of the fifth switching transistor outputs the second pull-down signal.

16. The display device according to claim 15, wherein, the pull-down maintaining module includes a sixth switching transistor, a seventh switching transistor, an eighth switching transistor and a third capacitor, wherein:
a control terminal of the sixth switching transistor receives the first clock signal, an input terminal of the sixth switching transistor is connected to an output terminal of the seventh switching transistor, and an output terminal of the sixth switching transistor is connected to the control terminal of the third switching transistor;
a control terminal of the seventh switching transistor is connected to the output terminal of the fourth switching transistor and the output terminal of the fifth switching transistor in order to receive the pull-down signal, an input terminal of the seventh switching transistor receives the high voltage level signal, and the output terminal of the seventh switching transistor is connected to the input terminal of the sixth switching transistor; and a control terminal of the eighth switching transistor is connected to the output terminal of the fourth switching transistor and the output terminal of the fifth switching transistor in order to receive the pull-down signal, an input terminal of the eighth switching transistor receives the high voltage level signal, and an output terminal of the eighth switching transistor outputs the second output control signal; and the third capacitor has two terminals, one terminal of the third capacitor is connected to the control terminal of the seventh switching transistor and the control terminal of the eighth switching transistor, and the other terminal of the third capacitor receives the high voltage level signal.

\* \* \* \* \*